(12) United States Patent
Camilus et al.

(10) Patent No.: US 11,783,203 B2
(45) Date of Patent: Oct. 10, 2023

(54) BUILDING ENERGY SYSTEM WITH ENERGY DATA SIMULATION FOR PRE-TRAINING PREDICTIVE BUILDING MODELS

(71) Applicant: Johnson Controls Tyco IP Holdings LLP, Milwaukee, WI (US)

(72) Inventors: Santle Camilus, Sunnyvale, CA (US); Manjuprakash R. Rao, Bangalore (IN)

(73) Assignee: JOHNSON CONTROLS TECHNOLOGY COMPANY, Auburn Hills, MI (US)

( * ) Notice: Subject to any disclaimer, the term of this patent is extended or adjusted under 35 U.S.C. 154(b) by 0 days.

(21) Appl. No.: 17/946,371

(22) Filed: Sep. 16, 2022

(65) Prior Publication Data
US 2023/0019836 A1   Jan. 19, 2023

Related U.S. Application Data

(63) Continuation of application No. 16/398,535, filed on Apr. 30, 2019, now abandoned.

(30) Foreign Application Priority Data

May 4, 2018   (IN) .............................. 201841016916

(51) Int. Cl.
*G05B 19/042* (2006.01)
*G06N 20/00* (2019.01)
(Continued)

(52) U.S. Cl.
CPC .............. *G06N 5/02* (2013.01); *G05B 19/042* (2013.01); *G06F 3/0482* (2013.01); *G06F 9/451* (2018.02);
(Continued)

(58) Field of Classification Search
CPC .......... G06N 3/08; G06N 20/00; G06N 3/084; G06N 3/02; G06N 3/10; G06N 5/025;
(Continued)

(56) References Cited

U.S. PATENT DOCUMENTS

| 7,502,768 B2 * | 3/2009 | Ahmed ..................... G06N 3/02 706/30 |
| 9,447,985 B2 | 9/2016 | Johnson |

(Continued)

FOREIGN PATENT DOCUMENTS

| CA | 2957726 A1 | 3/2016 |
| CA | 3043996 A1 | 2/2018 |

(Continued)

OTHER PUBLICATIONS

Wei, Deep Reinforcement Learning for Building HVAC Control (Year: 2017).*

(Continued)

*Primary Examiner* — Darrin D Dunn
(74) *Attorney, Agent, or Firm* — Foley & Lardner LLP

(57) ABSTRACT

A system for controlling heating, ventilation, or air conditioning (HVAC) equipment of a building includes one or more processing circuits configured to generate simulated building data using a simulation model of the building, pre-train a reinforcement learning (RL) model using the simulated building data, operate the HVAC equipment of the building using the RL model, and retrain the RL model using actual building data generated responsive to operating the HVAC equipment using the RL model.

18 Claims, 10 Drawing Sheets

(51) Int. Cl.
  *G06N 5/02* (2023.01)
  *G06F 9/451* (2018.01)
  *G06F 3/0482* (2013.01)
  *G06F 30/13* (2020.01)
(52) U.S. Cl.
  CPC .............. *G06F 30/13* (2020.01); *G06N 20/00* (2019.01); *G05B 2219/2639* (2013.01)
(58) Field of Classification Search
  CPC . G06F 30/27; G06F 1/20; G06F 1/206; G05B 13/027; G05B 17/02; G05B 13/024; G05B 13/0285; G05B 13/0265; G05B 13/048; G05B 2219/33056; G05B 2219/40499; G05B 2219/40515
  See application file for complete search history.

(56) References Cited

U.S. PATENT DOCUMENTS

| | | | |
|---|---|---|---|
| 9,869,484 B2 * | 1/2018 | Hester | F24F 11/48 |
| 10,871,756 B2 | 12/2020 | Johnson et al. | |
| 10,908,578 B2 | 2/2021 | Johnson et al. | |
| 10,921,768 B2 | 2/2021 | Johnson et al. | |
| 11,156,978 B2 | 10/2021 | Johnson et al. | |
| 2011/0046805 A1 | 2/2011 | Bedros et al. | |
| 2011/0282504 A1 | 11/2011 | Besore et al. | |
| 2013/0144546 A1 | 6/2013 | Brackney et al. | |
| 2015/0178865 A1 * | 6/2015 | Anderson | G06Q 50/163 |
| | | | 705/7.25 |
| 2015/0195741 A1 | 7/2015 | Jafarian et al. | |
| 2015/0253027 A1 * | 9/2015 | Lu | F24F 11/62 |
| | | | 700/276 |
| 2015/0300892 A1 * | 10/2015 | Malhotra | H04L 12/2807 |
| | | | 702/130 |
| 2016/0035052 A1 | 2/2016 | Tran | |
| 2016/0201933 A1 * | 7/2016 | Hester | F24F 11/48 |
| | | | 700/276 |
| 2016/0201934 A1 * | 7/2016 | Hester | F24F 11/89 |
| | | | 700/276 |
| 2016/0305678 A1 | 10/2016 | Pavlovski et al. | |
| 2017/0300599 A1 * | 10/2017 | Becerik-Gerber | G06F 30/20 |
| 2018/0113482 A1 | 4/2018 | Vitullo | |
| 2019/0163215 A1 * | 5/2019 | Cheng | G05B 15/02 |
| 2019/0187635 A1 | 6/2019 | Fan et al. | |
| 2019/0242608 A1 | 8/2019 | Laftchiev et al. | |
| 2019/0377306 A1 * | 12/2019 | Harvey | G05B 13/027 |
| 2020/0057825 A1 | 2/2020 | Motahar | |
| 2020/0151836 A1 | 5/2020 | Lingras et al. | |
| 2021/0119881 A1 * | 4/2021 | Shirazipour | H04L 41/16 |

FOREIGN PATENT DOCUMENTS

| | | |
|---|---|---|
| EP | 3 186 687 A4 | 7/2017 |
| EP | 3 497 377 A1 | 6/2019 |

OTHER PUBLICATIONS

CoolingLogic, "CoolingLogic: Up early, saving billions." URL: http://coolinglogic.com/documents/MarketingFlyer_FINAL_HiRes8.5x11.pdf, retrieved from internet Oct. 27, 2022 (1 page).
Incomplete File of Communication with Various Companies, etc. in 2016-2021, URL: http://coolinglogic.com/documents/22072101_Letters_and_Signature_Receipts.pdf, published, as one document, on: Jul. 21, 2022 (211 pages).
Johnson Heating and Cooling L.L.C., "Divine Grace Building Automation (Images)," URL: http://cooljohnson.com/Building-Automation-Systems-Michigan/Oakland-County-Michigan/Building-Automation-Images.html, retrieved from internet Oct. 27, 2022 (8 pages).
Johnson Heating and Cooling L.L.C., "Divine Grace Building Automation," URL: http://cooljohnson.com/Building-Automation-Systems-Michigan/Oakland-County-Michigan/Building-Automation-Divine-Grace.html, retrieved from internet Oct. 27, 2022 (3 pages).
Johnson Heating and Cooling L.L.C., "Excel Rehabilitation Building Automation," URL: http://cooljohnson.com/Building-Automation-Systems-Michigan/Waterford-Michigan/Building-Automation-System--Excel.html, retrieved from internet Oct. 27, 2022 (2 pages).
Johnson Heating and Cooling L.L.C., "Intertek Testing Services Building Automation," URL: http://cooljohnson.com/Building-Automation-Systems-Michigan/Plymouth-Michigan/Building-Automation-System-Plymouth-Michigan.html, retrieved from internet Oct. 27, 2022 (8 pages).
Johnson Heating and Cooling L.L.C., "JLA Medical Building Building Automation," URL: http://cooljohnson.com/Building-Automation-Systems-Michigan/Waterford-Michigan/Building-Automation-System--JLA.html, retrieved from internet Oct. 27, 2022 (3 pages).
Johnson Heating and Cooling L.L.C., "Mosaic Christian Building Automation (Images)," URL: http://cooljohnson.com/Building-Automation-Systems-Michigan/Detroit/Building-Automation-Images.html, retrieved from internet Oct. 27, 2022 (12 pages).
Johnson Heating and Cooling L.L.C., "Mosaic Christian Building Automation," URL: http://cooljohnson.com/Building-Automation-Systems-Michigan/Detroit/Mosaic-Christian.html, retrieved from internet Oct. 27, 2022 (5 pages).
Johnson Heating and Cooling L.L.C., "Shepherd's Gate Lutheran Church Building Automation," URL: http://cooljohnson.com/Building-Automation-Systems-Michigan/Shelby-Township-Michigan/Building-Automation-Systems-SG.html, retrieved from internet Oct. 27, 2022 (3 pages).
Johnson Heating and Cooling L.L.C., "St. Clair County Residence Building Automation," URL: http://cooljohnson.com/Building-Automation-Systems-Michigan/St-Clair-Michigan/Building-Automation-System-St-Clair-Michigan.html, retrieved from internet Oct. 27, 2022 (4 pages).
Johnson Heating and Cooling L.L.C., "St. Joseph Mercy Oakland U. C. Building Automation," URL: http://cooljohnson.com/Building-Automation-Systems-Michigan/Waterford-Michigan/Building-Automation-Systems-SJMO.html, retrieved from internet Oct. 27, 2022 (2 pages).
Johnson Heating and Cooling L.L.C., "Waterford Internal Medicine Building Automation," URL: http://cooljohnson.com/Building-Automation-Systems-Michigan/Waterford-Michigan/Building-Automation-Systems-WIM.html, retrieved from internet Oct. 27, 2022 (3 pages).
Johnson Heating and Cooling, LLC, "Building Automation Clawson Michigan 2.0," URL: http://cooljohnson.com/Building-Automation-Systems-Michigan/Clawson-Michigan/Building-Automation-Clawson-Manor-2.html, retrieved from the internet Oct. 27, 2022 (6 pages).
Johnson Heating and Cooling, LLC, "Building Automation Images Clawson Michigan 2.0," URL: http://cooljohnson.com/Building-Automation-Systems-Michigan/Clawson-Michigan/Building-Automation-Clawson-Manor-2-Images.html, retrieved from the internet Oct. 27, 2022 (14 pages).
Johnson Heating and Cooling, LLC, "Building Automation System Clawson Michigan Clawson Manor," URL: http://cooljohnson.com/Building-Automation-Systems-Michigan/Clawson-Michigan/Building-Automation-System-Clawson-Manor.html; retrieved from the internet Oct. 27, 2022 (3 pages).
Johnson Heating and Cooling, LLC, "Building Automation System in Michigan Images," URL: http://cooljohnson.com/Building-Automation-Systems-Michigan/Macomb-County-Michigan/Building-Automation-Images.html; retrieved from the internet Oct. 27, 2022 (13 pages).
Johnson Heating and Cooling, LLC, "Building Automation System in Michigan," URL: http://cooljohnson.com/Building-Automation-Systems-Michigan/Macomb-County-Michigan/Building-Automation-Confidential-Customer.html; retrieved from the internet, Oct. 27, 2022 (4 pages).
Johnson Solid State LLC, "Building Automation Equipment," URL: http://cooljohnson.com/Video/Building_Automation/Confidential_Customer_BLD_2/Building_Automation_Equipment.mp4, retrieved from internet Oct. 27, 2022 (35 pages).

(56) References Cited

OTHER PUBLICATIONS

Johnson Solid State LLC, "Building Automation GUI," URL: http://cooljohnson.com/Video/Building_Automation/Confidential_Customer_BLD_2/Building_Automation_GUI.mp4, retrieved from internet Oct. 27, 2022 (24 pages).
Johnson Solid State LLC, "Cooling Logic Overview," URL: http://coolinglogic.com/documents/CoolingLogic_Overview_High_Quality.mp4, retrieved from internet Oct. 27, 2022 (16 pages).
Johnson Solid State LLC, "So what is CoolingLogic™?" URL: http://coolinglogic.com/Coolinglogic-How-it-Works.html, retrieved from the internet Oct. 27, 2022 (3 pages).
Johnson, David, "A Method to Increase HVAC System Efficiency And Decrease Energy Consumption," White Paper: Johnson Solid State, LLC, URL: http://coolinglogic.com/documents/16102106_White_Paper_High_Resolution_Protected.pdf, Sep. 24, 2016 (51 pages).
Johnson, David, "CoolingLogic™: Mosaic Christian Church A Case Study," Report: Johnson Solid State, LLC, URL: http://coolinglogic.com/documents/19020301_Mosaic_Christian_Coolinglogic_Case_Study.pdf, Feb. 2, 2019 (140 pages).
Johnson, David, "Excel Rehabilitation Building Automation: Building Automation System User Manual ," URL: http://cooljohnson.com/Building-Automation-Systems-Michigan/Waterford-Michigan/Building-Automation-System-Excel-Manual.html, 2012 (10 pages).
Johnson, David, "Temperature Control System and Methods for Operating Same," Pre-Publication printout of U.S. Appl. No. 15/231,943, filed Aug. 9, 2016, URL: http://coolinglogic.com/documents/16080901_CIP_As_Filed.pdf (99 pages).
Johnson, David., "CoolingLogic™: Changing the Way You Cool," Report: Johnson Solid State, LLC, URL: http://coolinglogic.com/documents/18111303_Changing_the_way_you_Cool.pdf, Nov. 7, 2018 (12 pages).
Ahmad et al., "A review on applications of ANN and SVM for building electrical energy consumption forecasting," Renewable and Sustainable Energy Reviews, 2014, vol. 33 (pp. 102-109).
Berardi, U., "Building energy consumption in US, EU, and BRIC countries," Procedia Engineering, 2015, vol. 118 (pp. 128-136).
EnergyPlus, URL: https://energyplus.net/, accessed on Apr. 13, 2018 (2 pages).
Eppy Tutorial, URL: https://pythonhosted.org/eppy/Main_Tutorial.html, dated Jul. 13, 2018 (26 pages).
Krzaczek et al., "Indoor Air Quality and Thermal Comfort in Naturally Ventilated Low-energy Residential Houses," Air Quality—Monitoring and Modeling, 2012 (40 pages).
Kumar et al., "Energy analysis of a building using artificial neutral network: A review," Energy and Buildings, 2013, vol. 65 (pp. 352-358).
Nametevs, "Deep Reinforcement Learning on HVAC Control," Information Technology and Management Science 21, pp. 29-36 (2018).
U.S. Energy Information Administration, "International Energy Outlook 2016: With Projections to 2040," May 2016 (290 pages).
Van Hasselt, H., "Double Q-learning," Adventures in Neural Information Processing Systems, 2011, vol. 23 (pp. 2613-2622).
Van Ottterlo et al., "Reinforcement Learning and Markov Decision Processes," Reinforcement Learning, Chapter 1, 2012, vol. 12 (pp. 3-42).
Wei, et al., "Deep Reinforcement Learning for Building HVAC Control," DAC '17: Proceedings of the 54th Annual Design Automation Conference, 6 pages (2017).

* cited by examiner

© 2019, Johnson Controls Technology Company

```
def Window_Material_Shade(IDF_file):
    new_window_material_shade = IDF_file.newidfobject(
        'WindowMaterial:Shade'.upper())
    new_window_material_shade.Name = 'WINDOW SHADE'
    new_window_material_shade.Solar_Transmittence = 0.075
    new_window_material_shade.Solar_Reflectance = 0.7
    new_window_material_shade.Visible_Transmittance = 0.032
    new_window_material_shade.Visible_Reflectance = 0.5
    new_window_material_shade.Infrared_Hemispherical_Emissivity = 0.15
    new_window_material_shade.Infrared.Transmittamce = 0.41
    new_window_material_shade.Thickness = 0.0004
    new_window_material_shade.Conductivity = 0.1
    new_window_material_shade.Shade_to_Glass_Distance = 0.05
    new_window_material_shade.Top_Opening_Multiplier = 0.1
    new_window_material_shade.Bottom_Opening_Multiplier = 0.1
    new_window_material_shade.LeftSide_Opening_Multiplier = 0
    new_window_material_shade.Rightside_Opening_Multiplier = 0
    new_window_material_shade.Airflow_Permeability = 0.3
    return IDF_file
```

FIG. 8

© 2019, Johnson Controls Technology Company

```
q_matrix[current_state,action] = q_matrix[current_state, action] +
alpha_learning_rate * TD_error where TD_error = TD_target - q_matrix[current_state, action]
TD_target = single_value_reward + gamma * min_value
min_value = q_matrix[action, min_index]
min_index = where(q_matrix[action, ] == np.min(q_matrix[action, ]))
single_value_reward = function(normalized_energy_consumed,comfort_cost)
```

FIG. 9

BUILDING ENERGY SYSTEM WITH ENERGY DATA SIMULATION FOR PRE-TRAINING PREDICTIVE BUILDING MODELS

CROSS-REFERENCE TO RELATED PATENT APPLICATIONS

This application is a continuation of U.S. patent application Ser. No. 16/398,535 filed Apr. 30, 2019, which claims the benefit of and priority to Indian Provisional Patent Application No. 201841016916 filed May 4, 2018, both of which are incorporated by reference herein in their entireties.

BACKGROUND

The present disclosure relates generally to the field of building management systems for buildings. The present disclosure relates more particularly to systems and methods for generating control settings for energy management of building equipment of a building management system.

Some building management systems are configured to generate control decisions for a building, e.g., generate a temperature setpoint for a building. Often, the temperature setpoint generated by the building management system fails to result in user comfort or ideal energy usage when the building management system is deployed for a new building. The building management system does not store any information regarding historical operation of the building since the building may be new and no such data may exist. Therefore, the building management system operates with poor user comfort and poor energy usage since no historical information is available to the building.

SUMMARY

One implementation of the present disclosure is a building energy system for a building, the building energy system including one or more memory devices configured to store instructions thereon, that, when executed by one or more processors, cause the one or more processors to receive a building model, the building model defining a physical construction of the building, generate predicted energy usage data of the building based on the building model and historical weather data, train a predictive building model based on the predicted energy usage data, wherein the predictive building model indicates a prediction of an optimal equipment operating setting, generate the optimal equipment operating setting based on the predictive building model, and operate one or more pieces of building equipment based on the optimal equipment setting to control an environmental condition of the building.

In some embodiments, the instructions cause the one or more processors to generate a user interface including an input interface element for receiving or defining the building model of the building, a first output interface element indicating the optimal equipment setting, and a second output interface element indicating energy savings resulting from operating at the optimal equipment setting.

In some embodiments, the instructions cause the one or more processors to generate a user input interface for graphically defining the building model, receive user input defining the building model via the user input interface, and generate the building model based on the user input.

In some embodiments, the instructions cause the one or more processors to record an electric load amount associated with the optimal equipment setting, generate a plot of the electric load amount associated with the optimal equipment setting and other electric load amounts associated with other equipment settings, and cause a user device to display the plot.

In some embodiments, the environmental condition is at least one of a temperature, a humidity, an air quality, or a light level. In some embodiments, the optimal equipment operating setting is at least one of a temperature setpoint, a humidity setpoint, an air quality setting, or a light level setting.

In some embodiments, the instructions cause the one or more processors to train the predictive building model by minimizing energy usage associated with the one or more pieces of building equipment and maintaining a comfortable level of the environmental condition of the building.

In some embodiments, the instructions cause the one or more processors to pseudo-randomly generate one or more equipment learning settings, generate the predicted energy usage data based on the pseudo-randomly generated one or more equipment learning settings, and train the predictive building model based on the predicted energy usage data, the pseudo-randomly generated one or more equipment learning settings, and the historical weather data.

In some embodiments, the instructions cause the one or more processors to collect actual building data of the building from one or more sensors and re-train the predictive building model based on the actual building data.

In some embodiments, the instructions cause the one or more processors to receive user feedback from a user device, wherein the user feedback indicates a comfort level of a user of the user device and re-train the predictive building model based on the user feedback.

Another implementation of the present disclosure is a method of building control of a building. The method includes receiving, by one or more processing circuits, a building model, the building model defining a physical construction of the building, generating, by the one or more processing circuits, predicted energy usage data of the building based on the building model and historical weather data, training, by the one or more processing circuits, a predictive building model based on the predicted energy usage data, wherein the predictive building model indicates a prediction of an optimal equipment operating setting, generating, by the one or more processing circuits, the optimal equipment operating setting based on the predictive building model, and operating, by the one or more processing circuits, one or more pieces of building equipment based on the optimal equipment setting to control an environmental condition of the building.

In some embodiments, the method includes generating, by the one or more processing circuits, a user interface including an input interface element for receiving or defining the building model of the building, a first output interface element indicating the optimal equipment setting, and a second output interface element indicating energy savings resulting from operating at the optimal equipment setting.

In some embodiments, the method includes generating, by the one or more processing circuits, a user input interface for graphically defining the building model, receiving, by the one or more processing circuits, user input defining the building model via the user input interface, and generating, by the one or more processing circuits, the building model based on the user input.

In some embodiments, the method includes recording, by the one or more processing circuits, an electric load amount associated with the optimal equipment setting, generating, by the one or more processing circuits, a plot of the electric load amount associated with the optimal equipment setting and other electric load amounts associated with other equipment settings, and causing, by the one or more processing circuits, a user device to display the plot.

In some embodiments, the environmental condition is at least one of a temperature, a humidity, an air quality, or a light level. In some embodiments, the optimal equipment operating setting is at least one of a temperature setpoint, a humidity setpoint, an air quality setting, or a light level setting.

In some embodiments, the method further includes training, by the one or more processing circuits, the predictive building model by minimizing energy usage and maintaining a comfortable level of the environmental condition of the building.

In some embodiments, the method further includes pseudo-randomly generating, by the one or more processing circuits, one or more equipment learning settings, generating, by the one or more processing circuits, the predicted energy usage data based on the pseudo-randomly generated one or more equipment learning settings, and training, by the one or more processing circuits, the predictive building model based on the predicted energy usage data, the pseudo-randomly generated one or more equipment learning settings, and the historical weather data.

In some embodiments, the method includes collecting, by the one or more processing circuits, actual building data of the building from one or more sensors and re-training, by the one or more processing circuits, the predictive building model based on the actual building data.

In some embodiments, the method includes receiving, by the one or more processing circuits, user feedback from a user device, wherein the user feedback indicates a comfort level of a user of the user device and re-training, by the one or more processing circuits, the predictive building model based on the user feedback.

Another implementation of the present disclosure is a building management system of a building, the building management system including building equipment configured to operate based on an equipment operating setting to control an environmental condition of the building and a processing circuit. The processing circuit is configured to receive a building model, the building model defining a physical construction of the building, generate predicted energy usage data of the building based on the building model and historical weather data, train a predictive building model based on the predicted energy usage data, wherein the predictive building model indicates a prediction of an optimal equipment operating setting, generate the optimal equipment operating setting based on the predictive building model, and cause the building equipment to operate based on the optimal equipment setting to control the environmental condition of the building.

In some embodiments, the processing circuit is configured to collect actual building data of the building from one or more sensors, receive user feedback from a user device, wherein the user feedback indicates a comfort level of a user of the user device, and re-train the predictive building model based on the actual building data and the user feedback.

BRIEF DESCRIPTION OF THE DRAWINGS

A portion of the disclosure of this patent document (including the Figures) contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 8 is a code snippet defining a window shade of a building model describing a physical building for the building energy system of FIG. 4, according to an exemplary embodiment.

FIG. 9 is a code snippet for a learning method for training the predictive building model of FIGS. 5-6 that can be implemented by the building energy system of FIG. 5, according to an exemplary embodiment.

DETAILED DESCRIPTION

Overview

Figure 1:
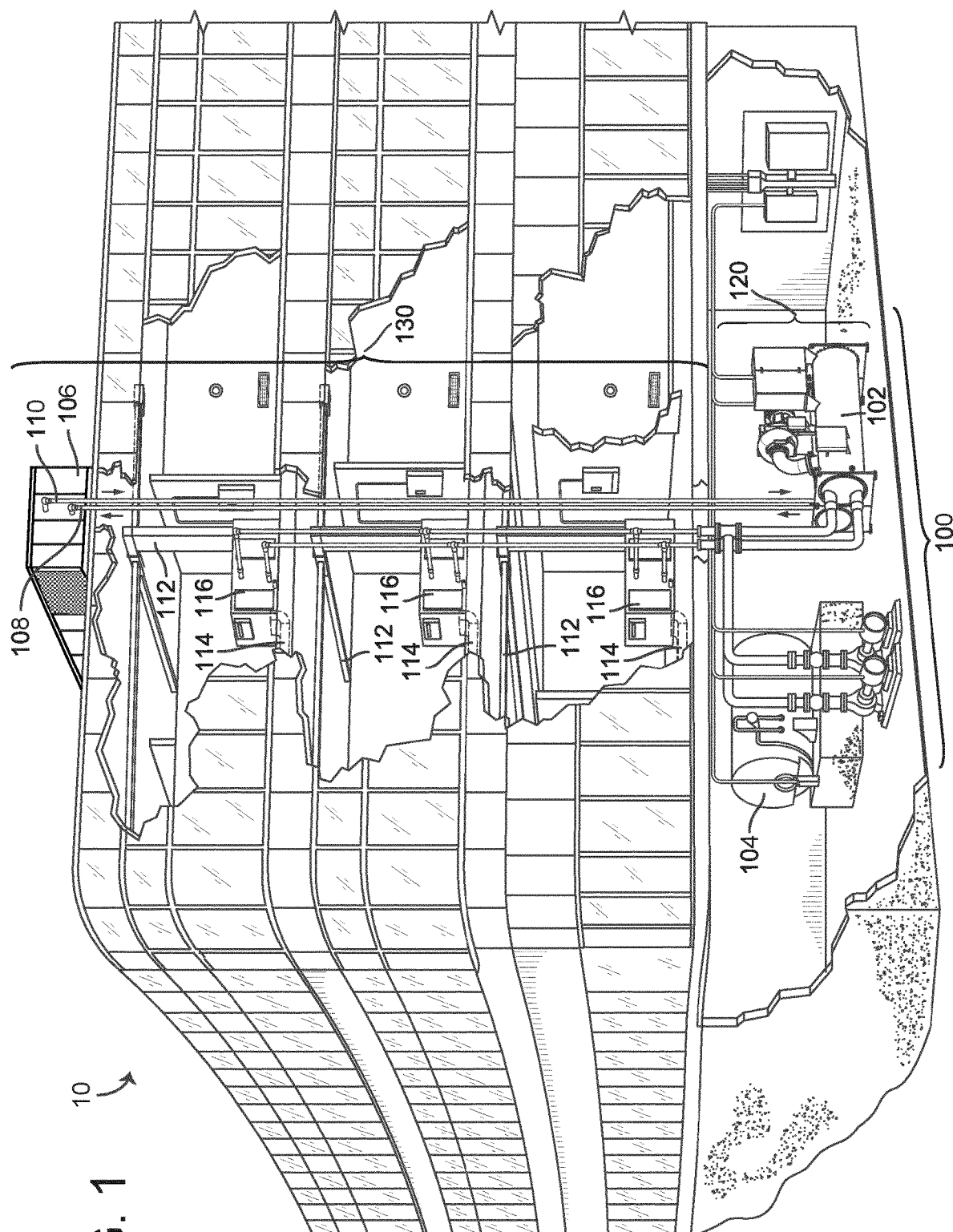
FIG. 1 is a drawing of a building equipped with a HVAC system, according to an exemplary embodiment.

Referring generally to the FIGURES, a building energy system for simulating energy data and pre-training a predictive building model is shown, according to various exemplary embodiments. Energy saving algorithms for buildings may be solutions that building operators can use to reduce their building operating costs. Building energy savings can be realized in both commercial and residential buildings. In a large commercial building, campuses, and/or cities, cost savings resulting from efficiently controlling the energy usage of a building can realize millions to billions of dollars in savings every year. The energy savings systems and methods as discussed herein can realize these types of energy cost savings. The systems and methods discussed herein can reduce and optimize energy consumption in buildings to save operational costs as well as making the buildings environment friendly. Sensors along with intelligent hardware and software components can be used to optimize both energy consumption and user comfort.

The building energy system can be configured to perform deep learning to realize energy savings by generating optimal control settings for building equipment. The building energy system can be configured to utilize reinforcement learning to generate predictive building models that can be used to optimally control building equipment.

When a predictive building model is deployed for a new building, the building model may not be trained and may not operate optimally until sufficient data for the building is collected and the model is trained based on the collected data. In this regard, the building energy system can be configured to simulate energy usage data for a building and use the simulated energy usage data to pre-train the predictive building model so that upon deployment of the predictive building model for a new building, the predictive building model is already trained.

The building energy system can be configured to utilize tools such as EnergyPlus, a software application developed by the U.S. Department of Energy (DOE). EnergyPlus can be used to estimate energy consumption of a building during and/or after the design phase of the building. By combining energy usage predictions and deep learning, the building energy system can be configured to generate a predictive building model for energy savings that can be deployed before any actual data for the building is collected.

The building energy system as described herein can enable smart buildings to perform energy savings and can generate cost savings for both individuals, building owners, and customers. The building energy system can be deployed the very first day a building is operational and energy savings can be realized for the building immediately. The models can be trained using reinforcement learning and the models can be used to predict building parameters such as setpoint temperature, humidity, illumination, etc.

By simulating energy usage data to give an estimate of the energy consumption of a building even before it is built or operated, a building model can be trained and deployed before any actual building data is collected. Simulation and testing of the building energy system discussed herein realized a 10% savings of total energy by optimally setting temperature setpoint values. However, the building energy system can also be used to control environmental settings such as humidity, lighting, air quality, acoustics, etc. These settings can be optimized together and/or alone. By taking into account these environmental conditions, approximately 40-50% energy savings on total energy consumption can be realized, significantly reducing building operating costs.

Building Management System and HVAC System

Figure 2:
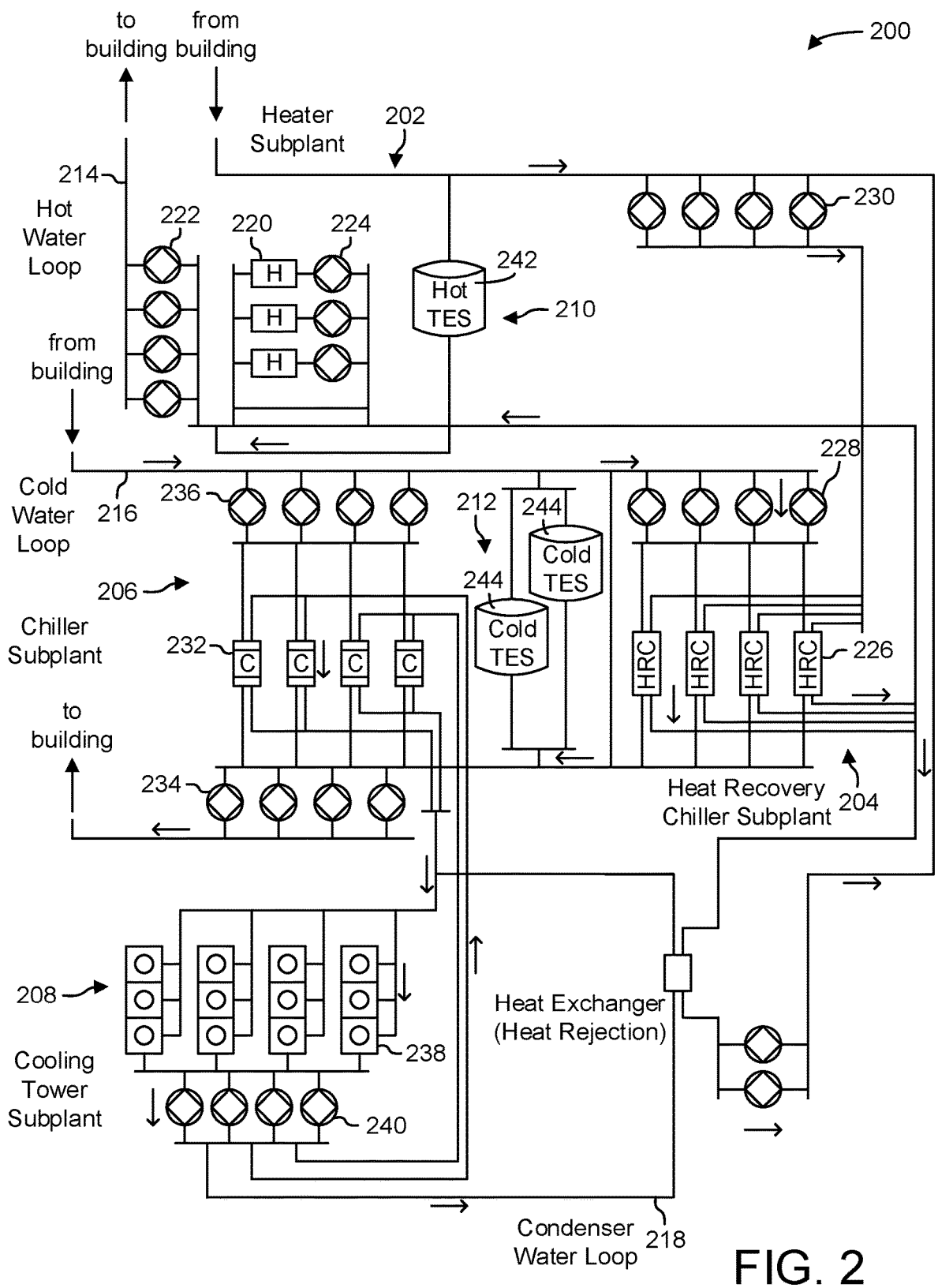
FIG. 2 is a block diagram of a waterside system that may be used in conjunction with the building of FIG. 1, according to an exemplary embodiment.
Figure 3:
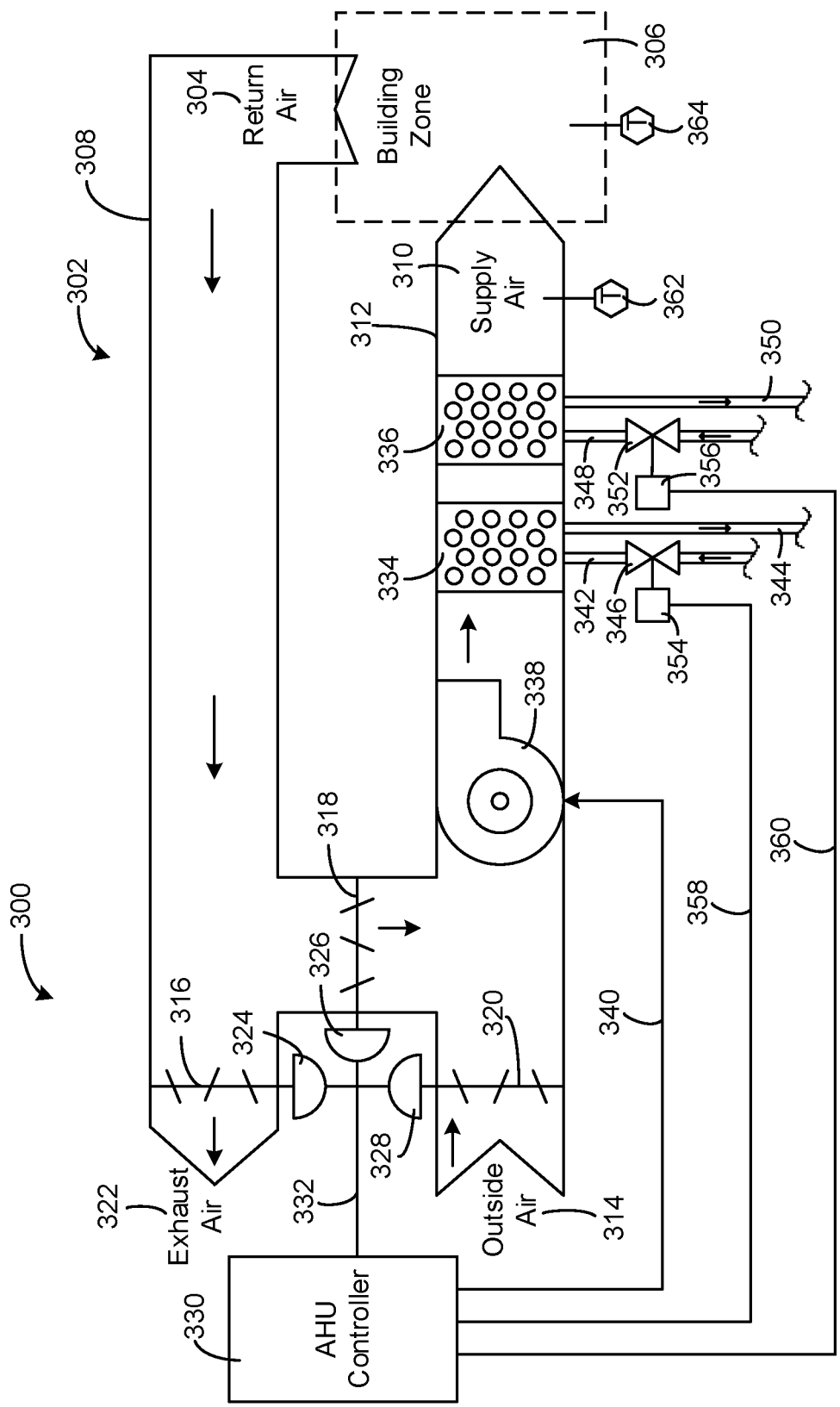
FIG. 3 is a block diagram of an airside system that may be used in conjunction with the building of FIG. 1, according to an exemplary embodiment.

Referring now to FIGS. 1-3, an exemplary building management system (BMS) and HVAC system in which the systems and methods of the present invention can be implemented are shown, according to an exemplary embodiment. Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, a HVAC system, a security system, a lighting system, a fire alerting system, any other system that is capable of managing building functions or devices, or any combination thereof.

The BMS that serves building 10 includes an HVAC system 100. HVAC system 100 can include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 can provide a heated or chilled fluid to an air handling unit of airside system 130. Airside system 130 can use the heated or chilled fluid to heat or cool an airflow provided to building 10. An exemplary waterside system and airside system which can be used in HVAC system 100 are described in greater detail with reference to FIGS. 2-3.

HVAC system 100 is shown to include a chiller 102, a boiler 104, and a rooftop air handling unit (AHU) 106. Waterside system 120 can use boiler 104 and chiller 102 to heat or cool a working fluid (e.g., water, glycol, etc.) and can circulate the working fluid to AHU 106. In various embodiments, the HVAC devices of waterside system 120 can be located in or around building 10 (as shown in FIG. 1) or at an offsite location such as a central plant (e.g., a chiller plant, a steam plant, a heat plant, etc.). The working fluid can be heated in boiler 104 or cooled in chiller 102, depending on whether heating or cooling is required in building 10. Boiler 104 can add heat to the circulated fluid, for example, by burning a combustible material (e.g., natural gas) or using an electric heating element. Chiller 102 can place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 can be transported to AHU 106 via piping 108.

AHU 106 can place the working fluid in a heat exchange relationship with an airflow passing through AHU 106 (e.g., via one or more stages of cooling coils and/or heating coils). The airflow can be, for example, outside air, return air from within building 10, or a combination of both. AHU 106 can transfer heat between the airflow and the working fluid to provide heating or cooling for the airflow. For example, AHU 106 can include one or more fans or blowers configured to pass the airflow over or through a heat exchanger containing the working fluid. The working fluid can then return to chiller 102 or boiler 104 via piping 110.

Airside system 130 can deliver the airflow supplied by AHU 106 (i.e., the supply airflow) to building 10 via air supply ducts 112 and can provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 can include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 can include various sensors (e.g., temperature sensors, pressure sensors, etc.) configured to measure attributes of the supply airflow. AHU 106 can receive input from sensors located within AHU 106 and/or within the building zone and can adjust the flow rate, temperature, or other attributes of the supply airflow through AHU 106 to achieve set-point conditions for the building zone.

Referring now to FIG. 2, a block diagram of a waterside system 200 is shown, according to an exemplary embodiment. In various embodiments, waterside system 200 can supplement or replace waterside system 120 in HVAC system 100 or can be implemented separate from HVAC system 100. When implemented in HVAC system 100, waterside system 200 can include a subset of the HVAC devices in HVAC system 100 (e.g., boiler 104, chiller 102, pumps, valves, etc.) and can operate to supply a heated or chilled fluid to AHU 106. The HVAC devices of waterside system 200 can be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 can be configured to heat water in a hot water loop 214 that circulates the hot water between heater subplant 202 and building 10. Chiller subplant 206 can be configured to chill water in a cold water loop 216 that circulates the cold water between chiller subplant 206 building 10. Heat recovery chiller subplant 204 can be configured to transfer heat from cold water loop 216 to hot water loop 214 to provide additional heating for the hot water and additional cooling for the cold water. Condenser water loop 218 can absorb heat from the cold water in chiller subplant 206 and reject the absorbed heat in cooling tower subplant 208 or transfer the absorbed heat to hot water loop 214. Hot TES subplant 210 and cold TES subplant 212 can store hot and cold thermal energy, respectively, for subsequent use.

Hot water loop 214 and cold water loop 216 can deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air can be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) can be used in place of or in addition to water to serve the thermal energy loads. In other embodiments, subplants 202-212 can provide heating and/or cooling directly to the building or campus without requiring an intermediate heat transfer fluid. These and other variations to waterside system 200 are within the teachings of the present invention.

Each of subplants 202-212 can include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 can also include one or more pumps or valves configured to control the flow rate of the hot water into or out of hot TES tank 242. Cold TES subplant 212 is shown to include cold TES tanks 244 configured to store the cold water for later use. Cold TES subplant 212 can also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves can be integrated with the pumps or positioned upstream or downstream of the pumps to control the fluid flows in waterside system 200. In various embodiments, waterside system 200 can include more, fewer, or different types of devices and/or subplants based on the particular configuration of waterside system 200 and the types of loads served by waterside system 200.

Referring now to FIG. 3, a block diagram of an airside system 300 is shown, according to an exemplary embodiment. In various embodiments, airside system 300 can supplement or replace airside system 130 in HVAC system 100 or can be implemented separate from HVAC system 100. When implemented in HVAC system 100, airside system 300 can include a subset of the HVAC devices in HVAC system 100 (e.g., AHU 106, VAV units 116, ducts 112-114, fans, dampers, etc.) and can be located in or around building 10. Airside system 300 can operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 can receive return air 304 from building zone 306 via return air duct 308 and can deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 can be configured to operate exhaust air damper 316, mixing damper 318, and outside air damper 320 to control an amount of outside air 314 and return air 304 that combine to form supply air 310. Any return air 304 that does not pass through mixing damper 318 can be exhausted from AHU 302 through exhaust air damper 316 as exhaust air 322.

Each of dampers 316-320 can be operated by an actuator. For example, exhaust air damper 316 can be operated by actuator 324, mixing damper 318 can be operated by actuator 326, and outside air damper 320 can be operated by actuator 328. Actuators 324-328 can communicate with an AHU controller 330 via a communications link 332. Actuators 324-328 can receive control signals from AHU controller 330 and can provide feedback signals to AHU controller 330. Feedback signals can include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that can be collected, stored, or used by actuators 324-328. AHU controller 330 can be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 can be configured to force supply air 310 through cooling coil 334 and/or heating coil 336 and provide supply air 310 to building zone 306. AHU controller 330 can communicate with fan 338 via communications link 340 to control a flow rate of supply air 310. In some embodiments, AHU controller 330 controls an amount of heating or cooling applied to supply air 310 by modulating a speed of fan 338.

Cooling coil 334 can receive a chilled fluid from waterside system 200 (e.g., from cold water loop 216) via piping 342 and can return the chilled fluid to waterside system 200 via piping 344. Valve 346 can be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 can receive a heated fluid from waterside system 200 (e.g., from hot water loop 214) via piping 348 and can return the heated fluid to waterside system 200 via piping 350. Valve 352 can be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 can be controlled by an actuator. For example, valve 346 can be controlled by actuator 354 and valve 352 can be controlled by actuator 356. Actuators 354-356 can communicate with AHU controller 330 via communications links 358-360. Actuators 354-356 can receive control signals from AHU controller 330 and can provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 can also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a set-point temperature for supply air 310 or to maintain the temperature of supply air 310 within a set-point temperature range). The positions of valves 346 and 352 affect the amount of heating or cooling provided to supply air 310 by cooling coil 334 or heating coil 336 and may correlate with the amount of energy consumed to achieve a desired supply air temperature. AHU controller 330 can control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 can include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 can communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 can be separate (as shown in FIG. 3) or integrated. In an integrated implementation, AHU controller 330 can be a software module configured for execution by a processor of BMS controller 366.

In some embodiments, AHU controller 330 receives information from BMS controller 366 (e.g., commands, set-points, operating boundaries, etc.) and provides information to BMS controller 366 (e.g., temperature measurements, valve or actuator positions, operating statuses, diagnostics, etc.). For example, AHU controller 330 can provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 can include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 can be a computer workstation, a client terminal, a remote or local interface, or any other type of user interface device. Client device 368 can be a stationary terminal or a mobile device. For example, client device 368 can be a desktop computer, a computer server with a user interface, a laptop computer, a tablet, a smartphone, a PDA, or any other type of mobile or non-mobile device. Client device 368 can communicate with BMS controller 366 and/or AHU controller 330 via communications link 372.

Data Simulation and Pre-Training

Figure 4:
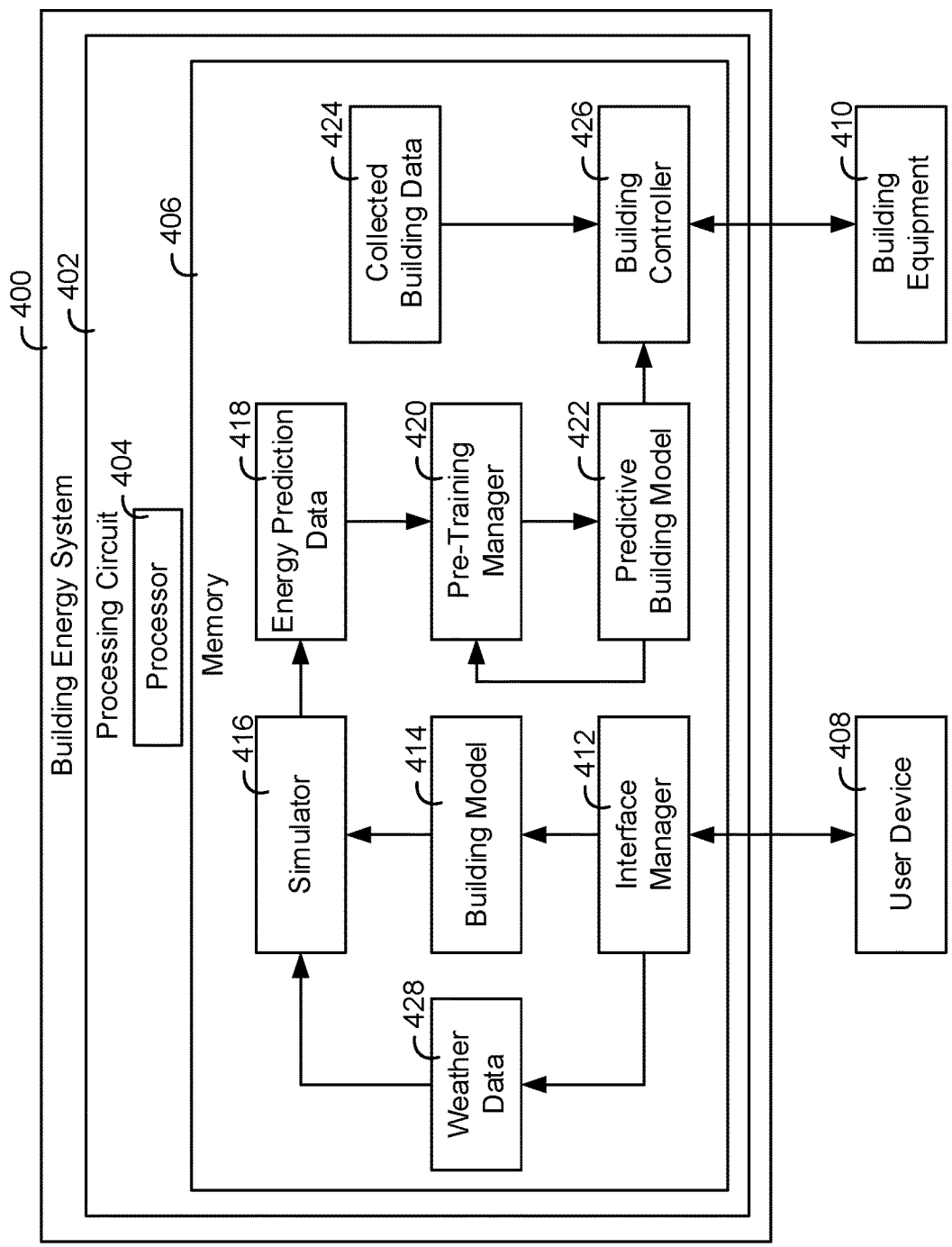
FIG. 4 is a block diagram of a building energy system for data simulation and pre-training a building control model, according to an exemplary embodiment.

Referring now to FIG. 4, a building energy system 400 is shown for simulating energy data and training a predictive building model, according to an exemplary embodiment. The building energy system 400 can be a server system, a computing system, a building controller, and/or any other computing device or system. In some embodiments, the building energy system 400 is an application run on a device (e.g., a laptop computer, a desktop computer, a server, a smartphone, a tablet, etc.). In some embodiments, the building energy system 400 part of a cloud server, e.g., AMAZON WEB SERVICES (AWS) or MICROSOFT AZURE. The building energy system 400, along with the user device 408 and/or the building equipment 410 can form a building management system for a building that can be deployed on-premises and/or off-premises (e.g., solely on-premises or off-premises or a combination of on-premises and off-premises devices and/or systems).

In some embodiments, the building energy system 400 can be configured to generate predictive models based on operational data gathered when a building associated with the building energy system 400 is in use for a period of time. The building energy system 400 can be configured to receive and/or capture historical data spanning several months to years and can be configured to use the historical data to perform machine learning to generate models e.g., a Q-learning model, a support vector machine, artificial neural network model (ANN) (e.g., convolutional neural networks (CNNs), recurrent neural networks (RNN)), decision trees, Bayesian models, deep learning algorithms, clustering algorithms, and/or any other type of supervised, unsupervised, and/or semi-supervised machine learning model.

The model can be used to predict operational settings that result in optimal energy usage and/or optimal user comfort based on weather data and/or historical building data. The building energy system 400 can be configured to use these models to predict building energy consumption. However, there may be a limitation in this operation since it may take a long time to collect and organize data to build models. For the building energy system 400 to train a fully functional model, it may take a few years.

For this reason, the building energy system 400 can be configured to perform data simulation and pre-training. The building energy system 400 can be configured to simulate energy usage data, train a predictive building model based on the simulated energy usage data, and operate a building based on the trained predictive building model. This allows the building energy system 400 to optimize the building energy consumption right from the very first day of the building is operational since the model can be trained by the energy system 400 based on simulated data even if actual historical data is not available.

As described herein, the building energy system 400 can be configured to utilize EnergyPlus to simulate building energy data. EnergyPlus is an energy simulation package that uses physical properties of buildings to model instantaneous energy consumption based on several operating conditions (e.g., ambient temperature, building occupancy, setpoint temperature, setpoint humidity, etc.).

The building energy system 400 can be configured to include and/or use EnergyPlus to simulate building data and train a deep neural network (or other model) to optimally configure various setpoints (e.g., thermostat settings at various zones in the building) to optimize energy consumption. Since the building energy system 400 can be configured to use simulated data which is a close representative of real-time operating conditions, the building energy system 400 can be configured to rapidly build building control models even before the building is commissioned for operation. For this reason, the building energy system 400 can be configured to generate building control models that can be deployed from the first day of the building operation which can cause a significant amount of energy and cost savings.

Still referring to FIG. 4, the building energy system 400 is shown to include a processing circuit 402 communicably coupled to a user device 408 and building equipment 410. In some embodiments, the building energy system 400 is made up of multiple processing circuits that are distributed across multiple computing systems, servers, controllers, etc. However, as an illustrative embodiment, the building energy system 400 is described with a single processing circuit, the processing circuit 402 which can be one or multiple processing circuits.

The processing circuit 402 is shown to include a processor 404 and a memory 406. The processing circuit 402 can include any number of processing devices and/or memory devices. The processor 404 can be implemented as a general purpose processor, an application specific integrated circuit (ASIC), one or more field programmable gate arrays (FPGAs), a group of processing components, or other suitable electronic processing components. The memory 406 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. The memory 406 can be or include volatile memory and/or non-volatile memory.

The memory 406 can include object code components, script components, or any other type of information structure for supporting the various activities and information structures described in the present application. According to some embodiments, the memory 406 is communicably connected to the processor 404 via the processing circuit 402 and can include computer code for executing (e.g., by the processing circuit 402 and/or the processor 404) one or more processes of functionality described herein.

The memory 406 is shown to include an interface manager 412. The interface manager 412 can be configured to communicate with the user device 408 to receive data from the user device 408 and/or send data to the user device 408. In some embodiments, the user device 408 is a mobile device (e.g., a laptop, a mobile phone, a tablet), a terminal device, a desktop computer, etc. The interface manager 412 can be configured to receive weather data 428 and a building model 414 from the user device 408. In some embodiments, the interface manager 412 generates a user interface that allows the user device 408 to generate the building model 414 and/or import the weather data 428. In some embodiments, the interface generated by the interface manager 412 is the same as and/or similar to the interfaces shown in FIGS. 10-12.

The memory 406 is shown to include a simulator 416. The simulator 416 may be and/or may be similar to the software application EnergyPlus. In some embodiments, the simulator 416 includes some and/or all of the features and/or functionality of EnergyPlus. EnergyPlus is a building energy modelling program that uses physics applied over a building structure and outside temperature to make predictions on energy consumption. In some embodiments, the simulator 416 includes one or more machine learning models configured to generate the energy prediction data 418 based on the building model 414 and/or the weather data 428. The simulator 416 can be configured to receive training data and train prediction models and/or update the prediction models over time. In some embodiments, the models utilized by the simulator 416 may be a Q-learning model, a support vector machines, artificial neural network model (ANN) (e.g., convolutional neural networks (CNNs), recurrent neural networks (RNN), decision trees, Bayesian models, deep learning algorithms, clustering algorithms, and/or any other type of supervised, unsupervised, and/or semi-supervised machine learning model. The simulator 416 can further use various physics modeling algorithms, heat transfer models, and/or equipment models to generate the energy prediction data 418.

The simulator 416 can be configured to generate energy prediction data 418 based on the weather data 428 and/or the building model 414. The building model 414 can be configured to normalize the weather data 428. In some embodiments, the simulator 416 can perform an average of the weather data 428 for multiple days and/or months of multiple years. For example, for ten years of October ambient temperature for a particular area, the simulator 416 can generate an average October ambient temperature by averaging the ambient temperature for October for the ten years. This normalized data can be used by the simulator 416 to generate the energy prediction data 418.

Furthermore, the simulator 416 can be configured to generate the energy prediction data 418 for multiple different operating parameters (e.g., setpoints). For example, the simulator 416 can be configured to pseudo-randomly generate various operating parameters and use the various operating parameters to generate the energy prediction data 418. For example, the simulator 416 can be configured to generate the training operating parameters by performing a Greedy Algorithm (e.g., a Pure Greedy Algorithm, an Orthogonal Greedy Algorithm, a Relaxed Greedy Algorithm, etc.) to generate pseudo-random operating parameters and/or ensure that the same two pseudo-random operating parameters are not generated twice.

The memory 406 is further shown to include a pre-training manager 420. The pre-training manager 420 can be configured to generate and/or train a predictive building model 422 based on the energy prediction data 418. The energy prediction data 418 can include an indication of energy usage, an operating parameter setting, and/or an indication of an ambient condition. For example, regarding temperature, the energy prediction data 418 may indicate a particular energy usage, a temperature setpoint, and an indication of an ambient temperature. The pre-training manager 420 can be configured to train the predictive building model 422 based on the energy prediction data 418 by using training algorithms such as Q-learning.

The predictive building model 422 can be utilized by the building controller 426 to control the building equipment 410. The building controller 426 can be configured to collect actual ambient data, e.g., the collected building data 424, and use the collected building data 424 to generate an operating setting for the building equipment 410 based on the predictive building model 422. In some embodiments, the building controller 426 can be configured to operate the building equipment 410 by dispatching the control setting to the building equipment 410.

The building controller 426 can be configured to use a variety of control algorithms (e.g., state-based algorithms, extremum-seeking control algorithms, proportional, integral, derivative (PID) control algorithms, model predictive control algorithms, feedback control algorithms, etc.) to determine appropriate control actions for the building equipment 410 as a function of the temperature, humidity, air quality, and/or any other environmental condition. The building equipment 410 that the building controller 426 can be configured to control can be thermostats, building controllers, air conditioners, air handler units (AHUs), boilers, chillers, environmental lighting systems, acoustics systems, etc. Examples of the building equipment 410 may be the equipment shown in FIGS. 1-3.

Furthermore, the building controller 426 can be configured to update and/or re-train the predictive building model 422. For example, once the predictive building model 422 is deployed and active, new data can be collected by the building controller 426. This new data, e.g., the collected building data 424 can be utilized by the building controller 426 to update and/or re-train the predictive building model 422 over time.

Figure 5:
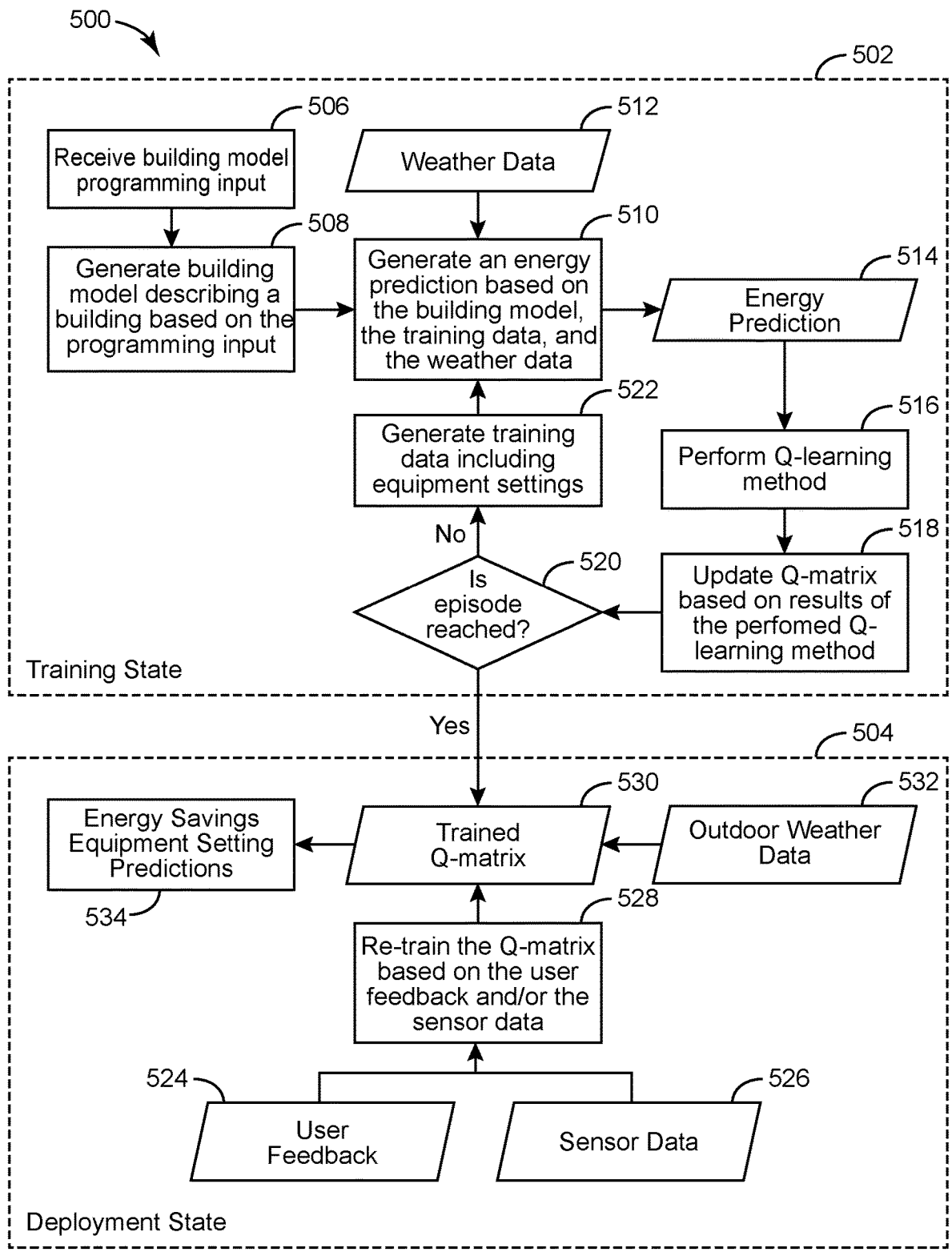
FIG. 5 is a flow diagram of a process for simulating energy data, pre-training a predictive building model, and re-training a deployed predictive building model, according to an exemplary embodiment.

Referring now to FIG. 5, a process 500 is shown for generating energy data and using the generated energy data to pre-train a predictive building model is shown, according to an exemplary embodiment. The process 500 can reduce energy consumption while also providing a user with environmental comfort. The building energy system 400 can be configured to perform the process 500. Furthermore, any computing device described herein can be configured to perform the process 500. The process 500 can be performed on an Amazon Web Services (AWS) EC2 instance cloud server. According to testing, it was found to take thirty minutes to train and generate a Q-learning model while the prediction of setpoint temperature for a day took less than a second. Furthermore, the process 500 can be performed for various parameters including indoor air quality, humidity, visual and acoustic comfort, etc.

The process 500 is shown to include two meta-states. The first meta-state is training state 502. In the training state 502, the process 500 can include steps for performing energy data simulation and model training before deployment in a building and/or before data is collected for the building (e.g., operational data for the building e.g., equipment operational decisions, energy usage, corresponding indoor and/or outdoor temperature data, occupant comfort indications, etc.). In the other meta-state, deployment state 504, the process 500 can include steps for operating building equipment based on the trained mode of the state 502 and can further refine and update the trained model based on actual collected data.

In the training state 502, the process 500 includes generating trained models that have the capability to predict building parameters. In the deployment state 504, the process 500 includes deploying the trained models of the training state 502 in the field and/or into various buildings. Accurate predictions of various building operational parameters, such as what should be a setpoint temperature of a thermostat in particular zone (e.g., a bed room) at a next hour can be determined by the model. As previously mentioned, generating learning models that are later used to make predictions may require large amounts of collected data.

In the process 500, EnergyPlus can be used as a simulation to generate historical data rather than and/or in addition to collecting the historical data. The process 500 includes steps of performing a deep learning (e.g., reinforcement learning), e.g., Q-learning, to learn from the simulated history data and update its knowledge base, a Q-matrix. The Q-matrix can act as a predefined model and can be used to predict setpoint temperature of a thermostat for the next month.

In step 506, the building energy system 400 can receive a building model programming input defining a physical construction of a building. In step 508, based on the received building model programming input, the building energy system 400 generates the building model 414. In some embodiments, an EnergyPlus Input File (IDF) file can be generated that defines a building (e.g., the building model 414). The building model can be generated based on EPPY programming, a form of python coding for generating an IDF. In some embodiments, the building model is a Computer Aided Design (CAD) and/or Building Information Model (BIM). Using a CAD and/or BIM may enable the generation of the building model to be automated and/or performed via computer graphics.

In step 510, an energy prediction 514 can be generated based on the building model defined in the step 508, training data, and/or outside weather data 512 (e.g., temperature data). In the step 510, the building energy system 400 can generate the energy prediction 514 based on an ambient condition (e.g., outdoor air temperature), a setpoint (e.g., a temperature setpoint), and a building model. The setpoint used in the step 510 can be varied as well as the outdoor ambient temperature to generate different energy predictions.

Outputs of a successful EnergyPlus run (e.g., the step 510) may be Comma-Separated Values (CSV) files that report various output variables: (1) Zone Mean Air Temperature; (2) Thermal Comfort ASHRAE 55 Simple Model Summer or Winter Clothes Not Comfortable Time; (3) Facility Cooling Set point Not Met While Occupied Time; (4) Facility Any Zone Oscillating Temperatures Time; (5) Electricity Consumed: Building; (6) Electricity Consumed: Zone-wise; (7) Interior Lights: Electricity Consumed; (8) Interior Equipment: Electricity Consumed; (9) Electricity Purchased: Facility and several others. These outputs may be customizable in the IDF file.

The weather data 512 may have significant influence on building characteristics. The weather data 512 may be an EnergyPlus Weather (EPW) file that includes hourly weather data for a day for every month for a year. In the step 510, the building energy system 400 can normalize the weather data 512 by taking data for a predefined number of previous years and averaging the data over each hour. Furthermore, in step 516, the building parameters (e.g., setpoints, equipment settings, etc.) can be automatically varied for every hour for a day to generate thousands of IDF files and generate corresponding energy consumption results that include total energy consumed by a building. This data can be used to train the deep learning models, e.g., the trained Q-matrix 530.

In step 516, based on the energy prediction 514, the weather data 512, and/or the training data, a model can be generated. In the step 512, the building energy system 400 can perform reinforcement learning. Reinforcement learning may be a deep learning method in which an agent is trained to select actions (e.g., optimal actions) from its current state based on a reward policy. The building energy system 400 can use Q-learning, a reinforcement learning method that maximizes a total reward. The Q-learning may be different from a greedy approach such that the nearby future steps need not be optimal in receiving the reward but the long-term reward are optimal. In this case, the long-term energy consumption from operating the trained Q-matrix 530 is reduced. For varying building parameters such as setpoint temperature of a day, the agent can update its knowledge base, a Q-matrix. The update to the Q-matrix can be performed based on the code snippet shown in FIG. 9.

The reward can be a function of total energy consumed and comfort of the user. The comfort can be a cost function that quantifies user comfort. The reward may be maximum if the total energy consumed is less and comfort of the user is high. The reward may be minimum if the total energy consumed is high and comfort of the user is low. The Q-matrix can be updated for a pre-determined number of episodes (step 520) such that the agent learns from several sample building parameters and their corresponding energy consumption and user comfort. The building energy system 400 learns, what should be the building parameters to reduce energy and achieve user comfort.

The Q-learning model can be deployed in a new building. When the building is operational, building sensor readings such as number of people present in zones, zonal setpoint temperature, humidity and others can be provided as inputs to the model, the model can predict building parameters for one or multiple hours into the future. These predicted parameters can be set on HVAC controllers and/or thermostats through software-hardware interactions, e.g., via Modbus/Lontalk.

EnergyPlus can estimate energy consumption and this can be used to train a Q-learning agent. Initially, the agent can be trained using the data for a previous month (e.g., September). During training, the Q-learning agent can be rewarded if a setpoint is within ASHRAE recommendation of thermal comfort while penalized if it is not. This condition forces the predictions for the setpoint temperature to range within the ASHRAE thermal comfort. The knowledge base of the agent can be saved as a model and used to predict temperature setpoint (predictions 534) for the following month (e.g., October) based on ambient conditions e.g., outside temperature (e.g. the outdoor weather data 532).

In step 522, training data can be generated that can include equipment settings. Generating the training data can be implemented through an ε-greedy policy in which during learning building equipment parameters are set randomly for 'ε' times and on other times the building parameters are based on already learned knowledge of the agent. At the end of training, the Q-matrix is a trained model that knows to predict building parameters for a day given the forecasted temperature of the day.

In step 528, the deployed model can be updated based on user feedback 524 and/or sensor data 526. After the deployment of Q-learning models in a building, the building energy system 400 can receive continuous feedback from users (user feedback 524) and/or continuously receive equipment data (e.g., the sensor data 526) and improve the building control model based on this feedback automatically. The users may be provided with a smart application using which they can provide feedback about their comfort level (e.g., too warm, too cold, etc.). The user feedback 524 can be used to generate additional training vector which can be used to train the model. As the reward is a function of comfort and the goal is to achieve long term reward value as well receive real-time feedback for comfort, the models are improved adaptively.

Another opportunity to adapt the model is providing actual sensor data, the sensor data 526, such as occupancy levels of a building in various zones during the course of normal operations of the buildings, temperature measurements of various zones, equipment energy usage data, etc. Such training with addition inputs parameter would make the models more efficient. There could be prediction models for occupancy level itself and the output of such models can be feed to Q-learning models to predict the optimal setpoint temperatures.

Figure 6:
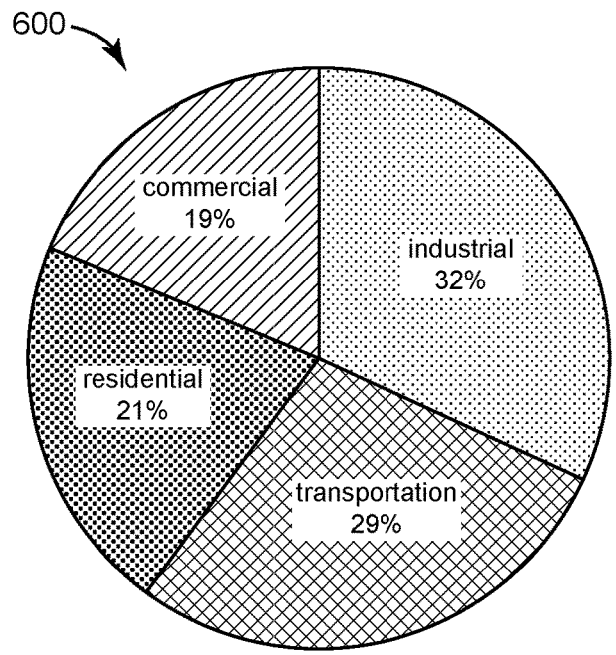
FIG. 6 is a chart illustrating energy consumption amounts for various energy consuming environments, according to an exemplary embodiment.

Referring now to FIG. 6, a chart 600 is shown illustrating energy usage for different environments, according to an exemplary embodiment. The chart 600 illustrates the energy consumption in the United States for the year 2016. As shown in chart 600, about 40% of the total United States energy usage in 2016 was consumed in residential and commercial buildings. Furthermore, energy consumption in the building sector (residential and commercial) accounts to 20.1% of the total energy delivered worldwide. This worldwide energy usage increases by an average of 1.8% every year from 2012 to 2040. For these reasons, the energy management features of the building energy system 400 can supply energy reduction for commercial and/or residential buildings can have a significant impact on total energy consumption of countries and/or the world.

Figure 7:
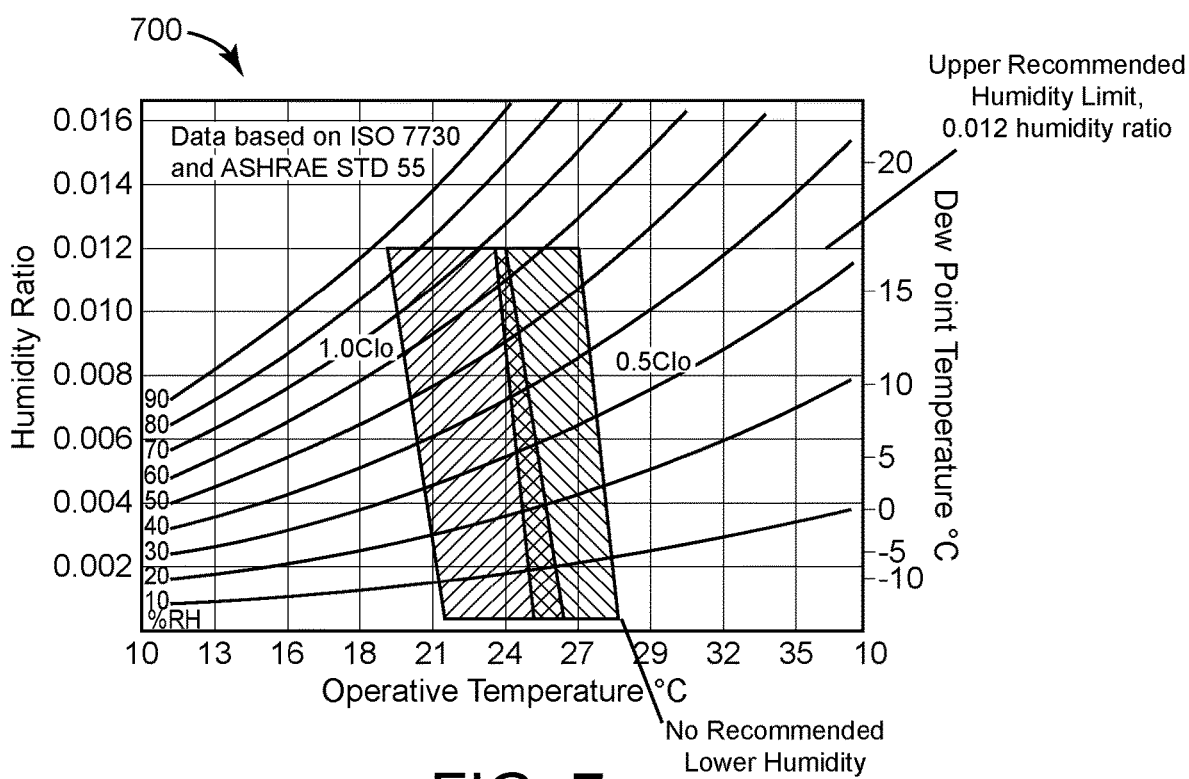
FIG. 7 is a chart illustrating ideal humidity and temperature levels for comfort as defined by the American Society of Heating Refrigerating and Air-Conditioning Engineers (ASHRAE), according to an exemplary embodiment.

Referring now to FIG. 7, a chart 700 of the ASHRAE recommendation for temperature and humidity levels to achieve thermal comfort is shown, according to an exemplary embodiment. The building energy system 400 can take into account the chart 700 and/or various other indications of user comfort level to balance equipment settings between comfortable settings and energy efficient settings. There may be four factors that affect the comfort level inside a building: (i) thermal comfort (ii) visual comfort (iii) acoustic comfort and (iv) indoor air quality. Thermal comfort is measured as a function of temperature and humidity as shown in in the ASHRAE recommendations of chart 700. Visual comfort is maintaining proper luminance level by solar radiation/lighting. Acoustic comfort enhances speech intelligibility and privacy. Indoor air quality is a measure of carbon dioxide level in the air. There may be tradeoffs between building parameters. For example, allowing more solar radiation for better illumination requires more energy consumed for cooling during summer. To save energy, an accurate setting of building parameters can be implemented by the building energy system 400.

Referring now to FIG. 8 a code snippet 800 is shown of a sample EPPY module that contains a definition of window shade material for an IDF, according to an exemplary embodiment. The code snippet 800 can represent one physical element of a building model describing a set of physical characteristics of a building (e.g., size of a building, windows of the building, doors of the building, walls of the building, shades of the building, etc.). EnergyPlus can include a Graphical User Interface (GUI) program that accepts an EnergyPlus Input File (IDF) and a history weather data as EnergyPlus Weather (EPW) file. EnergyPlus can include a GUI editor through which one can edit IDFs manually. In some embodiments, several building parameters can be varied automatically e.g., setpoint temperature and humidity. For this reason, a python based programming EPPY module can be used to generate IDF files. An IDF file may have complete building details such as material used for construction, number of windows and doors and type of materials used, number of thermal zones, HVAC equipment details, setpoint temperature, setpoint humidity, number of people in thermal zones, etc.

The code snippet 800 specifies the properties of window shade materials. Window shades act as diffusers with transmittance and reflectance factors that can control temperature and light in a building. The parameter values of the code snippet 800 (e.g., transmittance, reflectance, emissivity, thickness, conductivity, etc.) quantify the physical properties of window shades and can vary from building to building based on type of shade materials used. The rate of temperature and light exchange between a building and outside can be estimated using these parameters. During winter, window shades are kept open to allow more sun light to enter in thereby increasing the temperature and visibility in a building at the same time reducing the amount of energy required to heat the building.

Referring now to FIG. 9, a code snippet 900 of the optimization for training the predictive building model 422 is shown, according to an exemplary embodiment. The code snippet 900 illustrates a Q-learning process for updating a Q-matrix. The code snippet 900 can be used by the building energy system 400 to perform the step 516, step 518, and/or step 528 of the process 500 as described with further reference to FIG. 5.

The code snippet 900 includes an update to the Q-matrix such that, overtime, the Q-matrix is updated to minimize energy usage and maximize user comfort according to, $$q\_matrix[current\_state,action]=q\_matrix[current\_state,action]+alpha\_learning\_rate*TD\_error$$

where q_matrix is the trained model and current_state and action are inputs to the q_matrix. The alpha_learning_rate may be a predefined value defining how quickly or slowly the model is trained while TD_error may define the error (the matrix not maximizing a reward) causing the model to be updated.

The error, TD_error, can be defined in terms of a target for the model and a current model, i.e., how closely the current model deviates from the target. In this regard, TD_error=TD_target−q_matrix[current_state,action]. The target, TD_target, can be defined based on a reward (single_value_reward), a predefined gamma value (gamma), and a minimum value of the model (min_value). The minimum value can be based on the model and a minimum index value (min_index). The reward can be based on a function of energy consumed (normalized_energy_consumed) and level of occupant comfort (comfort_cost).

Figure 10:
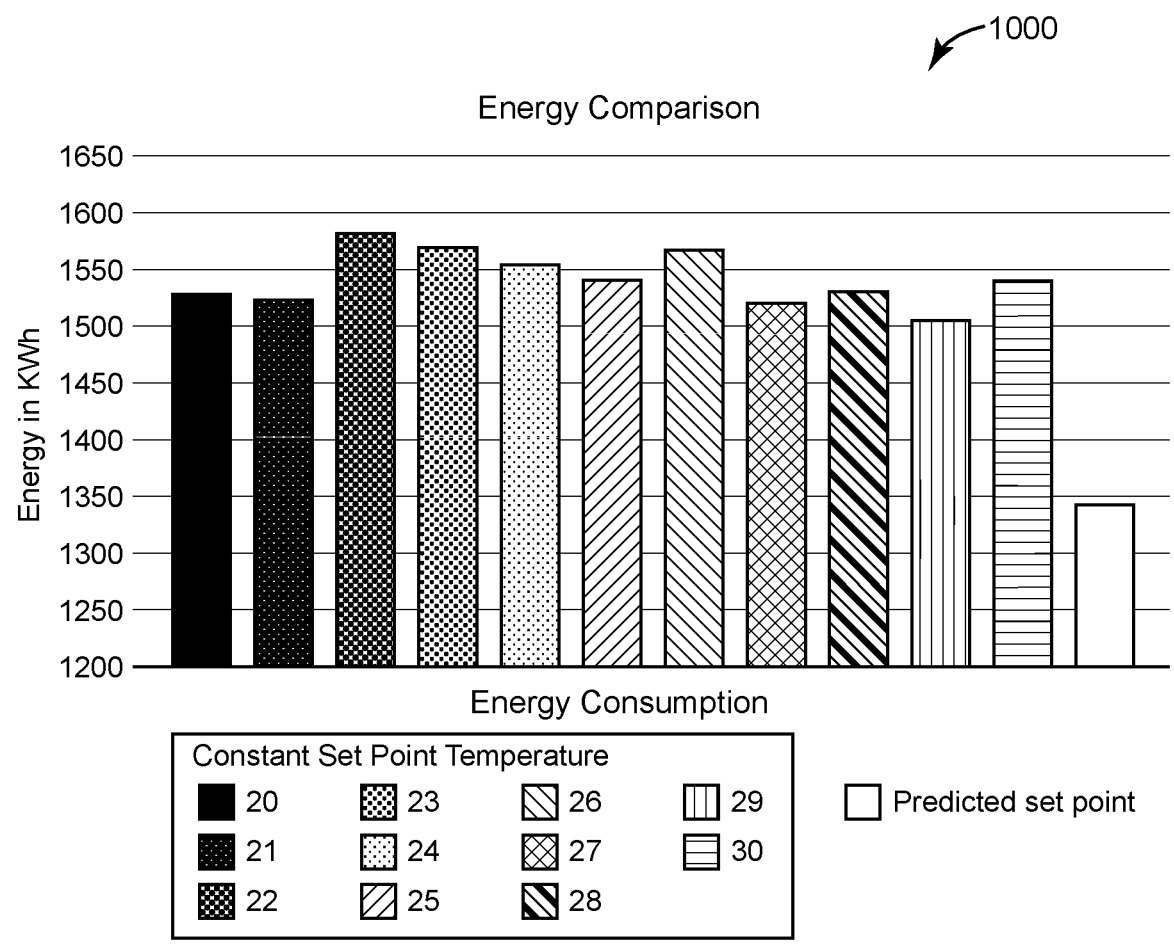
FIG. 10 is a chart illustrating energy savings of the building energy system of FIG. 4, according to an exemplary embodiment.

Referring now to FIG. 10, a chart 1000 illustrating energy usage and energy savings that results from the operation of the building energy system 400 is shown, according to an exemplary embodiment. The energy savings shown in chart 1000 may be test results for a supermarket, e.g., the supermarket defined in FIG. 11. In the absence of the building energy system 400, an end users fix constant temperature to a thermal zone. Energy consumption is estimated by fixing temperature setpoint to constant values from twenty to thirty degrees Celsius in a supermarket building. The results are plotted in the first eleven columns of the chart 1000. The building energy system 400 is used to predict temperature setpoints and the corresponding energy consumption of the predicted temperature setpoints is shown in chart 1000. All the predicted temperature setpoints are within the ASHRAE comfort range and the consumed energy in the building is shown in the last column.

From the chart 1000, it can be seen that the building energy system 400 can reduce energy usage of a building. It was found that on average, the energy consumption was reduced by at least by 10% by performing the techniques described with reference to FIGS. 4-5. The example of chart 1000 only considers temperature. If optimal setting of indoor air quality, humidity, visual and acoustic comfort are generated by the building energy system 400, it is forecast that the energy saving can go up to the range of 40-50% in the total energy consumption.

Figure 11:
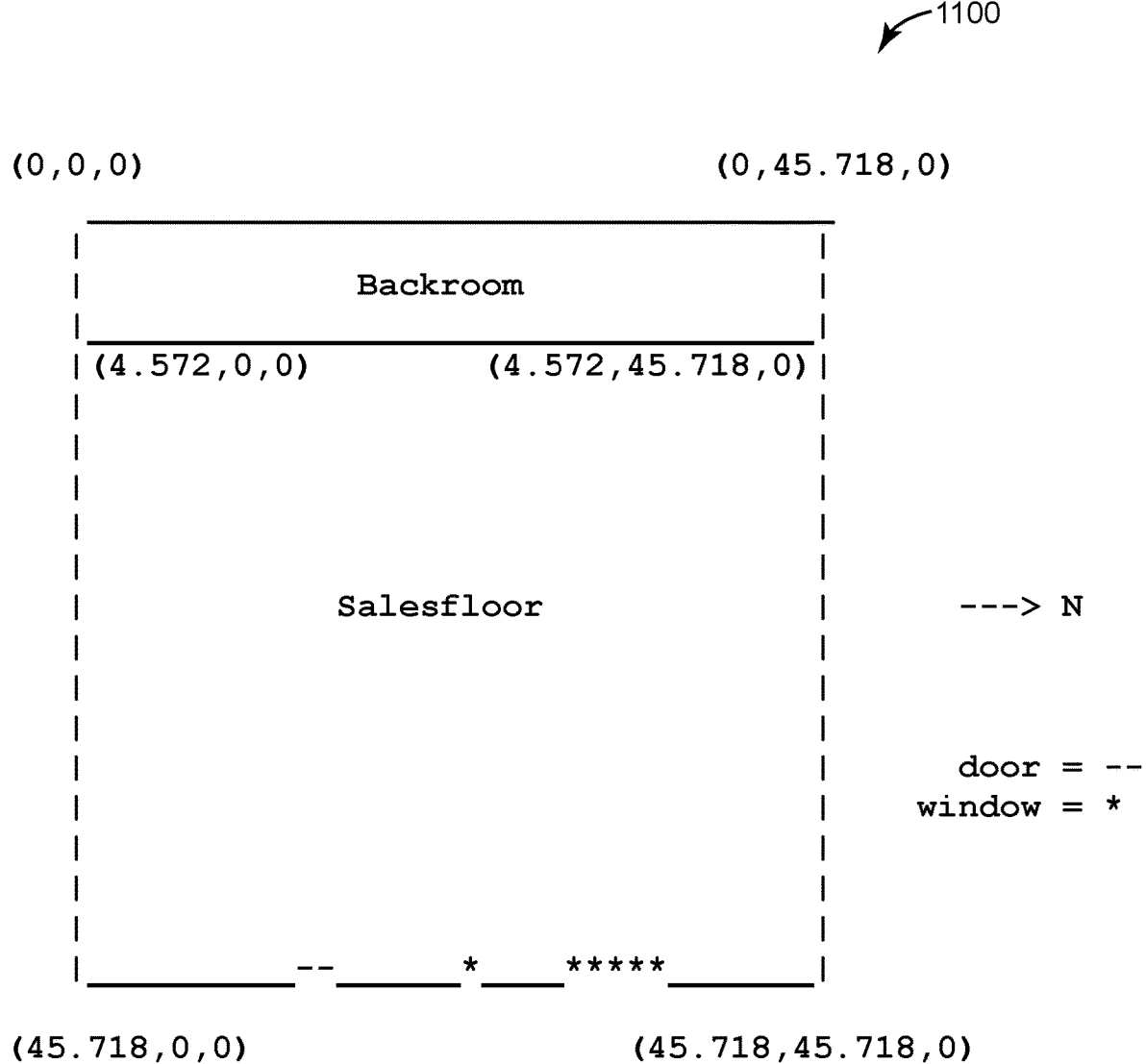
FIG. 11 is an interface indicating a building model that the building energy system of FIG. 4 can use to generate the building control model, according to an exemplary embodiment.

Referring now to FIG. 11, model 1100 of a building model for performing energy savings is shown, according to an exemplary embodiment. The model 1100 illustrates a supermarket building. The building energy system 400 was tested on the supermarket building. The building is a single story building with a floor area is 2090.1 m² and zone height is 4.26 m. There is one door and two windows in front of the building. There are two conditioned thermal zones: a back room with a lighting usage of 1,500 watts, equipment with a usage of 150 watts, 10 occupants and sales floor with a lighting usage of 45,000 watts equipment usage of 17,100 watts, and 150 occupants. The HVAC is a heating/cooling furnace with a refrigerant evaporator (DX) coil for cooling using an air-reheat strategy. Outdoor ventilation air is introduced through an air loop that has a fan, cooling coil, and heating coil. There is a central air handling equipment and each zone has an uncontrolled, single duct, air terminal. The building model 1100 is defined according to EPPY programming. However, the building structure can be inputted from Computer Aided Designs (CAD)/Building Information Models (BIM) which automate most of the work.

Figure 12:
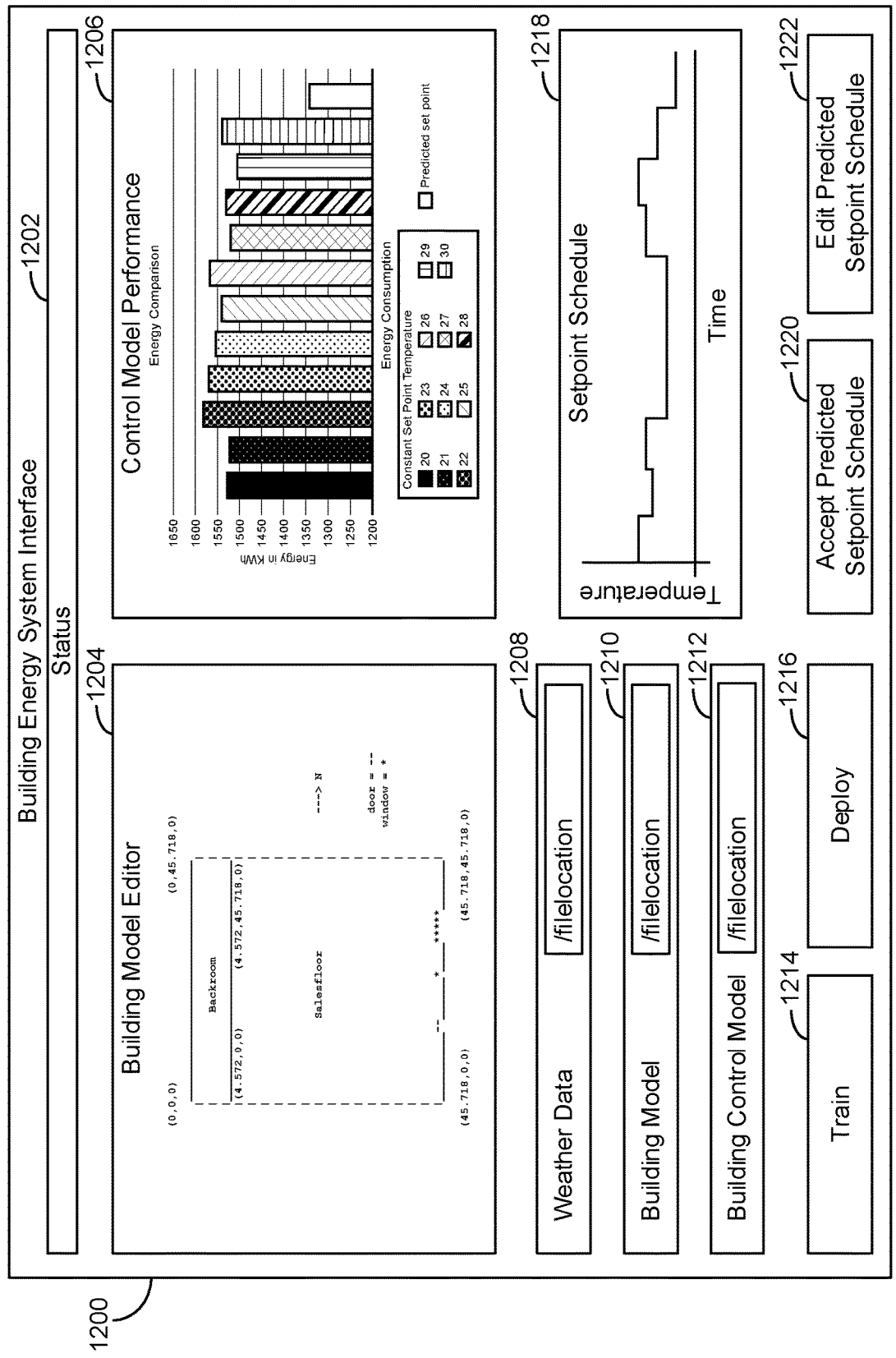
FIG. 12 is an interface that the building energy system of FIG. 4 can generate for generating and operating the building control model, according to an exemplary embodiment.

Referring now to FIG. 12, an interface 1200 is shown for receiving input from a user and displaying output to a user for the building energy system 400, according to an exemplary embodiment. The interface manager 412 can be configured to generate the interface 1200 and cause the user device 408 to display the interface 1200. In some embodiments, the interface manager 412 can be configured to cause the user device 408 to generate and/or display the user interface 1200. In interface 1200, a status 1202 is shown. The status 1202 can indicate the current status of the building energy system 400. For example, the status 1202 may indicate "training," "re-training," "deployed," etc. so that a user is aware of the current operation of the building energy system 400.

The interface 1200 is shown to include a building model editor 1204 and a control model performance 1206. The building model editor 1204 can be an interactive editor that allows a user to define a building. The building model editor 1204 can allow a user to define a model e.g., the model shown in FIG. 11. In some embodiments, the building model editor 1204 is a graphical model editor. In some embodiments, the building model editor 1204 is a text based (e.g., code based) model editor for defining the model. The control model performance 1206 may provide a user with an example of their energy usage. For example, the control model performance 1206 may indicate energy usage for one or more times based on constant temperature setpoints and/or temperature setpoints generated by the building energy system 400. Control model performance 1206 may be the same as and/or similar to the chart 1000 of FIG. 10.

In some embodiments, the building energy system 400 collects energy usage data indicating an electric load from operating at the optimal setpoint and/or setpoints of the setpoint schedule 1218. In this regard, the building energy system 400 can record the electric load overtime and plot the electric load so that a user can review the energy usage of the building for various hours, days, weeks, and/or months.

Interface 1200 is shown to include a weather data input 1208, a building model input 1210, and a building control model output 1212. Via the inputs 1208 and 1210 and the output 1212, a user can define file locations where weather data (e.g., a EWF) and/or a building model (e.g., an IDS) is located. The output 1212 may define where the trained building model is stored.

The interface 1200 is further shown to include a setpoint schedule 1218. The setpoint schedule 1218 may define the various temperature setpoints for various points in time (e.g., minutes, hours, days, etc.) that the trained model can be used to generate. A user can review the predicted temperature setpoints and make various adjustments to the setpoints via the setpoint schedule 1218. The building energy system 400 can identify the user feedback and use the user feedback to improve the trained model, e.g., the step 518 of the process 500.

The buttons train 1214, deploy 1216, accept 1220, and edit 1222 may allow a user control over the building energy system 400. The train button 1214 may cause the building energy system 400 to generate the predictive building model 422 based on user defined weather data and/or a user defined building model. The deploy button 1216 can cause the trained predictive building model 422 to be deployed. In some embodiments, accept predicted setpoint schedule 1220 may cause the setpoint schedule 1218 to be implemented in a building. Finally, the edit predicted setpoint schedule 1222 may cause the setpoint schedule 1218 to enter an editable mode allowing a user to adjust values for the setpoint at various times.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A system for controlling heating, ventilation, or air conditioning (HVAC) equipment of a building, the system comprising one or more processing circuits configured to:
generate simulated building data using a simulation model of the building, the simulation model of the building is configured to simulate building conditions and energy consumption of the building based on simulated weather data or historical weather data for a first time period prior to deploying a reinforcement learning (RL) model for the building;
pre-train the RL model using the simulated building data;
operate the HVAC equipment of the building by using the RL model to select control actions for the HVAC equipment based on actual weather data for a second time period after deploying the RL model for the building; and
retrain the RL model using actual building data generated responsive to operating the HVAC equipment using the RL model.

2. The system of claim 1, wherein the simulation model of the building is configured to simulate building conditions and energy consumption of the building based on simulated control actions for the HVAC equipment.

3. The system of claim 1, wherein:
the simulated building data comprise a set of states and corresponding simulated control actions for the HVAC equipment; and
pre-training the RL model using the simulated building data comprises training the RL model to select the control actions based on a current state and a reward policy.

4. The system of claim 1, wherein pre-training the RL model comprises training the RL model to maximize a reward based on at least one of energy consumption of the building or comfort of building occupants.

5. The system of claim 1, wherein:
pre-training the RL model using the simulated building data is performed prior to deploying the RL model in a building; and
operating the HVAC equipment of the building using the RL model and retraining the RL model using the actual building data are performed by a building controller of the building which receives the RL model after the pre-training.

6. The system of claim 1, wherein:
the HVAC equipment of the building comprise at least one of an air handling unit (AHU) or a rooftop unit (RTU); and
the control actions are for the AHU or the RTU.

7. The system of claim 1, wherein the RL model comprises at least one of a Q-learning model, a support vector machine, an artificial neural network (ANN), a convolutional neural network (CNN), a recurrent neural networks (RNN), a deep learning model, a supervised machine learning model, or an unsupervised machine learning model.

8. A method for controlling heating, ventilation, or air conditioning (HVAC) equipment of a building, the method comprising:
generating simulated building data using a simulation model of the building;
pre-training a reinforcement learning (RL) model using the simulated building data prior to deploying the RL model in the building;
operating, by a building controller which receives the RL model after the pre-training, the HVAC equipment of the building using the RL model; and
retraining, by the building controller, the RL model using actual building data generated responsive to operating the HVAC equipment using the RL model.

9. The method of claim 8, wherein generating the simulated building data comprises using the simulation model of the building to simulate building conditions and energy consumption of the building based on simulated control actions for the HVAC equipment.

10. The method of claim 8, wherein:
the simulated building data comprise a set of states and corresponding simulated control actions for the HVAC equipment; and
pre-training the RL model using the simulated building data comprises training the RL model to select control actions based on a current state and a reward policy.

11. The method of claim 8, wherein pre-training the RL model comprises training the RL model to maximize a reward based on at least one of energy consumption of the building or comfort of building occupants.

12. The method of claim 8, wherein:
generating the simulated building data comprises using the simulation model of the building to simulate building conditions and energy consumption of the building based on simulated weather data or historical weather data for a first time period prior to deploying the RL model in the building; and
operating the HVAC equipment comprises using the RL model to select control actions for the HVAC equipment based on actual weather data for a second time period after deploying the RL model in the building.

13. The method of claim 8, wherein:
the HVAC equipment of the building comprise at least one of an air handling unit (AHU) or a rooftop unit (RTU); and
operating the HVAC equipment of the building using the RL model comprises using the RL model to select control actions for the AHU or the RTU.

14. The method of claim 8, wherein the RL model comprises at least one of a Q-learning model, a support vector machine, an artificial neural network (ANN), a convolutional neural network (CNN), a recurrent neural networks (RNN), a deep learning model, a supervised machine learning model, or an unsupervised machine learning model.

15. One or more non-transitory computer-readable storage media storing instructions that, when executed by one or more processors, cause the one or more processors to perform operations comprising:
generating simulated building data using a simulation model of the building, the simulation model of the building is configured to simulate building conditions and energy consumption of the building based on simulated weather data or historical weather data for a first time period prior to deploying a reinforcement learning (RL) model for the building;
pre-training the reinforcement learning (RL) model using the simulated building data;
operating the HVAC equipment of the building by using the RL model to select control actions for the HVAC equipment based on actual weather data for a second time period after deploying the RL model for the building; and retraining the RL model using actual building data generated responsive to operating the HVAC equipment using the RL model.

16. The one or more non-transitory computer-readable storage media of claim 15, wherein generating the simulated building data comprises using the simulation model of the building to simulate building conditions and energy consumption of the building based on simulated control actions for the HVAC equipment.

17. The one or more non-transitory computer-readable storage media of claim 15, wherein:
   the simulated building data comprise a set of states and corresponding simulated control actions for the HVAC equipment; and
   pre-training the RL model using the simulated building data comprises training the RL model to select the control actions based on a current state and a reward policy.

18. The one or more non-transitory computer-readable storage media of claim 15, wherein:
   pre-training the RL model using the simulated building data is performed prior to deploying the RL model in a building; and
   operating the HVAC equipment of the building using the RL model and retraining the RL model using the actual building data are performed by a building controller of the building which receives the RL model after the pre-training.

* * * * *